(12) United States Patent
Roy

(10) Patent No.: US 6,572,731 B1
(45) Date of Patent: Jun. 3, 2003

(54) SELF-SIPHONING CMP TOOL DESIGN FOR APPLICATIONS SUCH AS COPPER CMP AND LOW-K DIELECTRIC CMP

(75) Inventor: Sudipto R. Roy, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/053,333

(22) Filed: Jan. 18, 2002

(51) Int. Cl.[7] ............................................. C23F 1/00
(52) U.S. Cl. ................................................. 156/345.12
(58) Field of Search ...................... 156/345.18, 345.12; 222/190, 191, 192, 204; 438/633, 645, 698, 692; 451/36, 66, 446; 134/1.3; 216/38, 93

(56) References Cited

U.S. PATENT DOCUMENTS

| | | | |
|---|---|---|---|
| 5,688,360 A | 11/1997 | Jairath | 156/345 |
| 5,709,593 A | 1/1998 | Guthrie et al. | 451/287 |
| 5,775,983 A | 7/1998 | Shendon et al. | 451/444 |
| 6,156,659 A * | 12/2000 | Roy | 438/692 |
| 6,231,427 B1 | 5/2001 | Talieh et al. | 451/41 |
| 6,234,868 B1 | 5/2001 | Easter et al. | 451/5 |
| 6,235,635 B1 | 5/2001 | Roy | 438/691 |
| 6,348,124 B1 * | 2/2002 | Garbett et al. | 156/345.12 |

* cited by examiner

Primary Examiner—Benjamin L. Utech
Assistant Examiner—Sylvia R. MacArthur
(74) Attorney, Agent, or Firm—George O. Saile; Rosemary L. S. Pike

(57) ABSTRACT

A new method is provided for the polishing of semiconductor surfaces such as the surface of a substrate, the surface of deposited copper and the surface of low-k layers of dielectric. The polishing method and apparatus of the invention comprise a new slurry delivery design whereby at least two different slurries can be independently controlled and mixed for delivery to a slurry container. The slurry container is in direct physical contact with a polishing pad, providing for the mixed slurry to be distributed over the surface of the polishing pad.

29 Claims, 2 Drawing Sheets

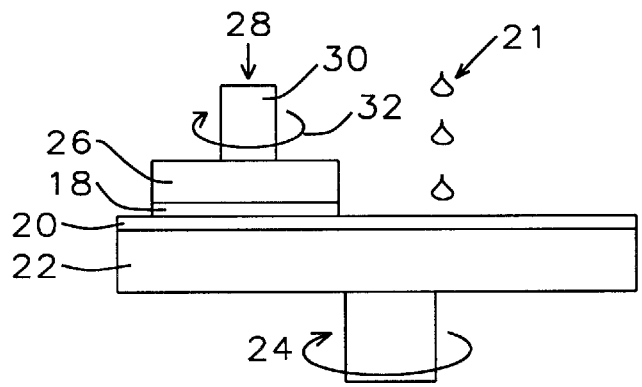
FIG. 1 - Prior Art
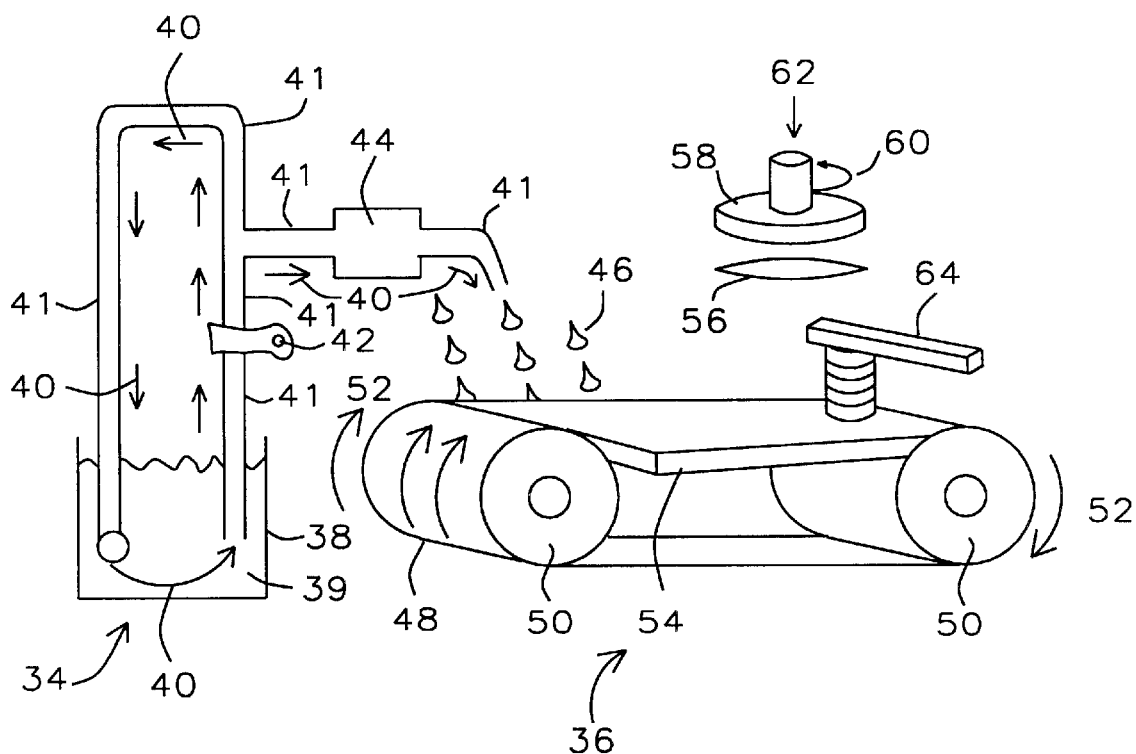
FIG. 2 - Prior Art

SELF-SIPHONING CMP TOOL DESIGN FOR APPLICATIONS SUCH AS COPPER CMP AND LOW-K DIELECTRIC CMP

BACKGROUND OF THE INVENTION (1) Field of the Invention

The invention relates to the fabrication of integrated circuit devices, and more particularly, to a method and apparatus for polishing surfaces that have special requirements or that impose unique challenges of surface polishing.

(2) Description of the Prior Art

Chemical Mechanical Polishing is a method of polishing the surface of a layer of semiconductor material, such as the surface of a semiconductor substrate, to a high degree of planarity and uniformity. The process is used to planarize semiconductor surfaces prior to the fabrication of semiconductor circuitry therein and thereon, and is also used to remove features of high elevation that are created during the fabrication of the microelectronic circuitry on the substrate. One typical chemical mechanical polishing process uses a large polishing pad, that is located on a rotating platen against which a substrate is positioned for polishing, and a positioning member which positions and biases the substrate on the rotating polishing pad. Chemical slurry, which may include abrasive materials, is maintained on the polishing pad to modify the polishing characteristics of the polishing pad in order to enhance the polishing of the substrate.

The use of chemical mechanical polishing to planarize semiconductor substrates continues to pose challenges, particularly where the process is used to evenly and uniformly remove high elevation features across the surface of a substrate. One primary problem, which has limited the used of chemical mechanical polishing in the semiconductor industry, is the limited ability to predict, much less control, the rate and uniformity at which the process will remove material from the substrate. As a result, CMP remains a labor-intensive process because the thickness and uniformity of the substrate must be constantly monitored to prevent over-polishing or inconsistent polishing of the surface of the substrate.

The profile of the polishing pad plays an important role in determining good overall polishing results. The polishing pad can, for instance, be profiled thick at the inner diameter of the polishing pad as compared to the outer diameter of the polishing pad and visa versa. The profile of the polishing pad is typically achieved by trial and error and by adjusting the position of a diamond dresser. The function of the diamond dresser is to maintain and/or restore the polishing characteristics of the polishing pad to the maximum extent possible during the polishing operation and in doing so to extend the useful life or the operating characteristics of the polishing pad. This method of profiling the polishing pad is destructive, time consuming and causes the loss of the polishing pad. Since this measure of the polishing pad profile can only be performed at the end of the useful life of the polishing pad, the wrong profile can only be detected after the polishing pad has served its useful life.

The polishing process is carried out until the surface of the wafer is ground to a highly planar state. During the polishing process, both the wafer surface and the polishing pad become abraded. After numerous wafers have been polished, the polishing pad becomes worn to the point where the efficiency of the polishing process is diminished and the rate of removal of material from the wafer surface is significantly reduced. It is usually at this point that the polishing pad is treated and restored to its initial state so that a high rate of uniform polishing can once again be obtained.

The invention addresses these and other concerns in providing a method and apparatus that specifically results in improved uniformity and planarity of the surface of the substrate and of the individual die that are being polished.

U.S. Pat. No. 5,709,593 (Guthrie et al.) shows a slurry distribution system.

U.S. Pat. No. 6,235,635 B1 (Roy) shows a CMP tool with in-situ open loop slurry distribution.

U.S. Pat. No. 6,234,868 BI (Easter et al.) shows a chemical-mechanical polish (CMP) slurry distribution system.

U.S. Pat. No. 5,775,983 (Shendon et al.) shows a method to condition a CMP pad.

U.S. Pat. No. 5,688,360 (Jairath) and U.S. Pat. No. 6,231,427 B1 (Talieh et al.) are related CMP and slurry distribution patents.

SUMMARY OF THE INVENTION

A principle objective of the invention is to provide a method and apparatus of Chemical Mechanical Polishing that assures even distribution of slurry over the surface that is being polished.

Another objective of the invention is to provide a method and apparatus of Chemical Mechanical Polishing that significantly reduces usage of required slurry, thus significantly reducing cost of polishing a semiconductor surface.

Yet another objective of the invention is to provide a method and apparatus of Chemical Mechanical Polishing that results in improved surface planarity and improved surface uniformity after the process of polishing has been completed.

A still further objective of the invention is to provide a method and apparatus of Chemical Mechanical Polishing that allows for uniform removal of spent slurry from the surface that is being polished.

In accordance with the objectives of the invention a new method is provided for the polishing of semiconductor surfaces such as the surface of a substrate, the surface of deposited copper and the surface of layers of low-k dielectric. The polishing method and apparatus of the invention comprise a new slurry delivery design whereby at least two different slurries can be independently controlled and mixed for delivery to a slurry container. The slurry container is in direct physical contact with a polishing pad, providing for the mixed slurry to be distributed over the surface of the polishing pad.

BRIEF DESCRIPTION OF THE DRAWINGS

FIG. 1 is a cross section of a prior art polishing apparatus.

FIG. 2 is a three dimensional view of a prior art polishing arrangement with the cross section of slurry supply system.

DESCRIPTION OF THE PREFERRED EMBODIMENTS

Figure 3:
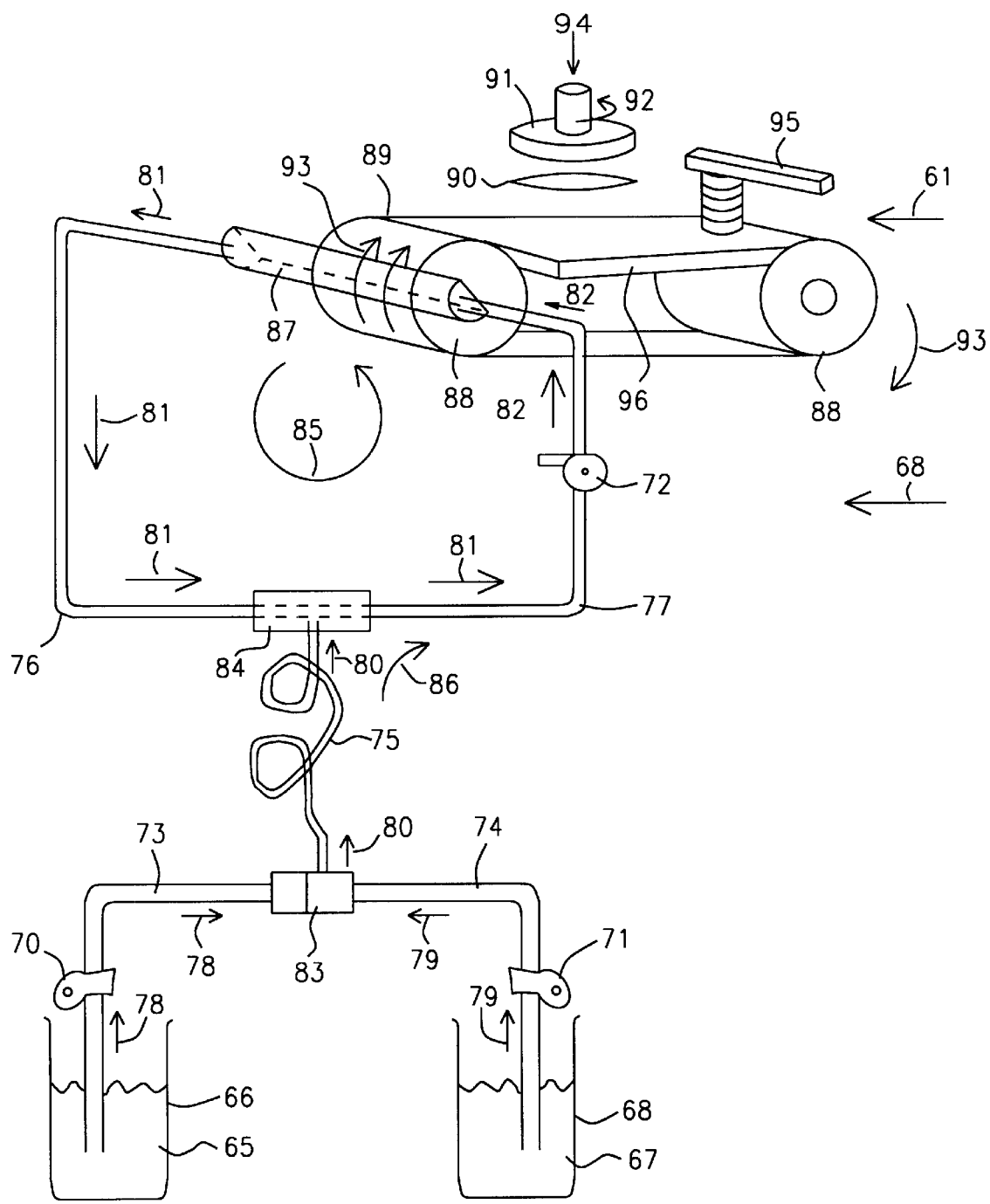
FIG. 3 is a three dimensional view of the polishing arrangement with the cross section of slurry supply system of the invention.

One of the conventional methods of polishing the surface of a semiconductor substrate positions the wafer on a circular, rotating carrier. The polishing pad consists of a belt that is moved forward in a continuing loop. By urging the surface of the substrate against an essentially flat surface portion of the polishing belt, a polishing action is realized. Two prior art methods of surface polishing are first briefly reviewed.

FIG. 1 shows a Prior Art CMP apparatus. A polishing pad 20 is affixed to a circular polishing table 22 that rotates in a direction indicated by arrow 24 at a rate in the order of 1 to 100 RPM. A wafer carrier 26 is used to hold wafer 18 face down against the polishing pad 20. The wafer 18 is held in place by applying a vacuum to the backside of the wafer (not shown). The wafer 18 can also be attached to the wafer carrier 26 by the application of a substrate attachment film (not shown) to the lower surface of the wafer carrier 26. The wafer carrier 26 also rotates as indicated by arrow 32, usually in the same direction as the polishing table 22, at a rate on the order of 1 to 100 RPM. Due to the rotation of the polishing table 22, the wafer 18 traverses a circular polishing path over the polishing pad 20. A force 28 is also applied in the downward vertical direction against wafer 18 and presses the wafer 18 against the polishing pad 20 as it is being polished. The force 28 is typically in the order of 0 to 15 pounds per square inch and is applied by means of a shaft 30 that is attached to the back of wafer carrier 26.

A prior art belt-type method of polishing the surface of a substrate is shown in the three dimensional view of such an arrangement that is shown in FIG. 2. The three-dimensional view of FIG. 2 shows a conventional linear CMP tool with open loop slurry dispensing. Highlighted in FIG. 2 are the following elements of the polishing apparatus:

34, the slurry distribution system of the polishing apparatus 36, the arrangement for mounting and moving the polishing pad of the polishing apparatus 38, the slurry vat or container 39, the slurry that is contained in the slurry vat and that is further distributed to the surface of the polishing pad 48

40, the flow of the slurry 41, the tubing through which the slurry 39 is moved from the slurry container 38 to the surface of the polishing pad 48

42, the pump that affects the flow 40 of slurry 39

44, the peristaltic pump that affects the distribution of the slurry across the surface of the belt pad 48

46, the slurry that is distributed in drop or vapor form over the surface of the polishing pad 48

48, the belt-shaped polishing pad 50, two drums over which the polishing pad 48 is mounted 52, the rotating motion of the drums 50, this rotation motion passes the polishing pad 48 in a linear motion across the surface of the substrate that is being polished 54, a platen that supports the polishing pad 48 where the polishing pad is in contact with the surface that is being polished 56, the surface (substrate) that is being polished 58, the substrate carrier on the surface of which the substrate 56 is mounted 60, the rotating motion of the substrate carrier 58

62, a downward pressure exerted on the substrate carrier 58 in order to affect increased polishing action 64, the polishing pad conditioner.

The operation of the apparatus that is shown in three dimensional view is as follows: the rotating wafer 56 is pressed against the polishing pad 48 that is linearly moved by the rotational motion 52 of drums 50. By controlling the force 62, the polishing action can be controlled. The belt system 36 imparts linear motion to the pad 48 in relation to the wafer 56. The slurry 46 is dispensed on the polishing pad 48 by the peristaltic pump 44.

It must be noted that the conventional approach that is shown in FIG. 2 does not allow for effective mixing of a multi-component slurry before the slurry is delivered to the point of use. The slurry components are typically pre-mixed, using the pre-mixed slurry poses problems of useful life of the container or pot in which the mixing action takes place. In addition, there is no exact metering of the slurry as this slurry is distributed across the face of the substrate that is being polished, due to the nature of the peristaltic pump 44. For these reasons, using the conventional methods as shown in FIG. 2, die uniformity across the surface of the substrate and planarity of the surface of the substrate after polishing is completed are difficult to realize. This limits the application of the method and apparatus of polishing the surface of a substrate. This limitation becomes especially severe where devices of sub-micron dimensions are created over or in the surface of the substrate. Device features such as Shallow Trench Isolation regions, copper damascene structures and layers of low-k dielectric suffer an especially negative impact as a consequence.

The method and apparatus of the invention address these problems and provide a method of even distribution of different slurries across the surface of a polishing pad. The method and apparatus of the invention improve polishing performance and, in addition, minimize the use of the required slurry, thereby reducing the cost of polishing substrate surfaces. Since, using the method and apparatus of the invention, slurry is uniformly removed from the surface of the polishing pad, surface planarity and uniformity of polishing across the surface of the substrate are significantly improved.

The method and apparatus of the invention will be explained using FIG. 3. The elements that are part of the method and apparatus of the invention are first highlighted, as follows:

61, the polishing part of the method and apparatus of the invention 68, the slurry distribution part of the method and apparatus of the invention 65, a first slurry 66, a first slurry container 67, a second slurry 68, a second slurry container 70, 71 and 72, a first, second and third pump respectively 73, 74, 75, 76 and 77 are first, second, third, fourth an fifth supply lines respectively 78, 79, 80, 81 and 82 are first, second, third, fourth an fifth slurry flows respectively 83, a splitter orifice box 84, a valve box 85, a first loop of slurry flow 86, a second loop of slurry flow 87, a slurry reservoir 88, two rollers of the polishing unit over which the polishing pad 89 is mounted 89, the polishing pad 90, the substrate that is being polished 91, the substrate carrier on the surface of which the substrate 90 is mounted 92, the rotational direction of substrate carrier 91

93, the rotational direction of drums 88 of the polishing unit 61

94, a downward pressure that is exerted on the substrate carrier 91

95, a polishing pad conditioner 96, a platen that is mounted underneath and in support of the polishing pad 89 where this polishing pad is in contact with the wafer 90 that is being polished.

The operation of the method and the apparatus of the invention can be explained as follows: the novelty of the invention is the inclusion of a new slurry delivery design that is integrated with the polishing tool. The multi-component slurries, that is slurries 65 and 67, are pumped using first and second pumps 70 and 71, these pumps can for instance be diaphragm pumps, causing slurry flows 78 and 79. Slurry flows 78 and 79 enter into the pre-set orifice flow meter of splitter box 83. The slurry is released from the splitter box into a single mixing tube 75, where the separate slurries 65 and 67 are mixed. The relative quantity of the slurries 65 and 67 that are mixed are determined by the setting of the orifice flow meter of splitter box 83. The mixed slurry 80 flows through valve box 84 and further advances, agitated by pump 72, through tubing 77 to slurry reservoir 87. Reservoir 87 is aligned and mounted in parallel with the polishing pad 89, the polishing pad 89 is immersed into the reservoir 87 at the time that the polishing pad passes the loft-most roller 88 of the polishing arrangement.

One of the most noticeable aspects of the slurry distribution system of the invention is that the two slurry supply loops 85 and 86 can be regulated independently from each other using the valve box 84. This as follows: if an adequate supply of slurry is present in reservoir 87, loop 85, a first slurry circulation loop, can be kept active thus supplying an (replacement) amount of slurry to the reservoir 87 and therefore to the polishing pad 89. If it is required that more slurry be supplied to reservoir 87, loop 86, a second slurry circulation loop, can be activated, thus replenishing any slurry deficiencies.

In addition, the distance between the reservoir 87 and the polishing pad 89, where these two elements physically interface, is calibrated in such a way that the slurry is uniformly transferred to the surface of the polishing pad 89 due to the relative motion of slurry between the reservoir 87 and the polishing pad 89. In this way, a fresh supply of slurry mix can be supplied to the surface of the polishing pad 89 and therefore to the surface of the substrate 90 that is being polished without having any issues of slurry pot life that are part of the conventional method of slurry distribution. This issue of slurry pot life typically has a significant negative effect on the application of CMP for front-end and back-end processing. Using the method and apparatus of the invention, the slurries 65 and 67 can be metered and applied very accurately, this unlike the conventional method whereby the peristaltic pump introduces a significant amount of slurry flow variation or drift.

As an added advantage of the method and apparatus of the invention, it must be observed that the use of a peristaltic pump is no longer required. This in view of the fact that the method and apparatus of the invention comprise a closed loop system, further resulting in reduced consumption of the required slurry.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A self-siphoning Chemical Mechanical Polishing apparatus for polishing of copper surfaces and surfaces of low-k dielectric layers, comprising:

a polishing part, said polishing part comprising a polishing pad; and a slurry distribution part, said slurry distribution part comprising a first slurry supply loop and a second slurry supply loop, said slurry distribution part further comprising a first interface between said first slurry supply loop and said second slurry supply loop, a first and a second mixture of slurry flowing into said first interface, a third mixture of slurry flowing from said first interface, said slurry distribution part further comprising a second interface between said slurry distribution part and said polishing part.

2. The apparatus of claim 1, said polishing part comprising:

two cylindrical rollers mounted with axis of said cylindrical rollers being in parallel while being separated by a distance;

said polishing pad mounted over outside surfaces of said two cylindrical rollers;

a substrate carrier for mounting a substrate on the surface thereof;

a polishing pad conditioner mounted aligned with and above said polishing pad;

a platen mounted underneath and in support of said polishing pad in a location where said polishing pad is in contact with said substrate during a process of polishing the surface of said substrate;

means for providing a rotating motion to said two cylindrical rollers in addition to means for providing a rotating motion to said substrate carrier; and means for exerting downward pressure on said substrate carrier.

3. The apparatus of claim 1, said first slurry supply loop comprising:

at least one first slurry container comprising a first slurry;

at least one second slurry container comprising a second slurry;

a splitter orifice box, said splitter orifice box being provided with an orifice flow meter, quantitatively controlling mixing said at least a first and said at least a second slurry, providing a first mixture of slurry;

means for flowing said at least a first slurry and said at least a second slurry to said splitter orifice box, comprising tubing in addition to slurry pump capabilities;

means for flowing said first mixture of slurry to said first interface, providing said first mixture of slurries to said first interface.

4. The apparatus of claim 1, said first interface between said first and second slurry supply loops comprising a valve box, said valve box being provided with means for independently regulating flow of said first mixture of slurry and said second mixture of slurry entering said valve box thereby creating a third mixture of slurry exiting said valve box.

5. The apparatus of claim 1, said at least one second slurry supply loop comprising:

means for flowing said third mixture of slurry from said valve box to said second interface, comprising tubing in addition to slurry pump capabilities, thereby providing said third mixture of slurry to said second interface; and means for flowing said second mixture of slurry from said second interface to said first interface.

6. The apparatus of claim 1, said first mixture of slurry and said a second mixture of slurry and third mixture of slurry being quantitatively interdependent.

7. The apparatus of claim 1, said interface between said slurry distribution part and said polishing pad comprising a slurry reservoir, said third mixture of slurry entering said slurry reservoir, said second mixture of slurry exiting said slurry reservoir, a fourth mixture of slurry being contained in said reservoir to a level, said slurry reservoir being aligned with and being mounted in parallel with said polishing pad, said polishing pad being immersed into said fourth mixture of slurry contained in said reservoir.

8. An apparatus for providing a mixture of slurry to a polishing pad, comprising:

at least one first slurry container comprising at least a first slurry;

at least one second slurry container comprising at least a second slurry;

means for flowing said at least a first slurry and said at least a second slurry to a splitter orifice box, said splitter orifice box mixing said at least a first slurry and said at least a second slurry, said splitter orifice box further having quantitative control over amounts of said at least a first slurry and said at least a second slurry being mixed, a first mixture of slurry exiting said splitter orifice box;

flowing said first mixture of slurry from said splitter orifice box to a valve box, a second mixture of slurry entering into said valve box, a third mixture of slurry exiting from said valve box, said valve box quantitatively controlling flow of said first mixture of slurry and said second mixture of slurry and said third mixture of slurry;

flowing said third mixture of slurry from said valve box to a third slurry container, said third slurry container comprising a fourth slurry mixture to a level, said third slurry container comprising an interface between said fourth slurry mixture and a polishing pad, said third mixture of slurry entering said third slurry container, said second mixture of slurry exiting said third slurry container, said third slurry container being aligned with and being mounted in parallel with said polishing pad, said polishing pad being immersed into said fourth mixture of slurry contained in said third slurry container; and flowing said third mixture of slurry from said third slurry container to said valve box.

9. The apparatus of claim 8, said polishing pad being provided by providing:

two cylindrical rollers;

said polishing pad mounted over outside surfaces of said two cylindrical rollers;

a substrate carrier for mounting a substrate on the surface thereof;

a polishing pad conditioner mounted aligned with and above said polishing pad;

a platen mounted underneath and in support of said polishing pad where said polishing pad is in contact with said substrate during a process of polishing the surface of said substrate;

means for providing rotating motion to said two cylindrical rollers in addition to means for providing rotating motion to said substrate carrier; and means for exerting downward pressure on said substrate carrier.

10. The apparatus of claim 8, whereby said first mixture of slurry and said a second mixture of slurry and third mixture of slurry are quantitatively interdependent.

11. The apparatus of claim 8, said apparatus being applied for polishing of copper surfaces and surfaces of low-k dielectric layers.

12. A method for polishing copper surfaces layers, comprising the steps of:

(i) providing at least one semiconductor substrate, said substrate having been provided with copper surfaces in the surface thereof;

(ii) providing a self-siphoning Chemical Mechanical Polishing apparatus for polishing of said copper surfaces, said a self-siphoning Chemical Mechanical Polishing apparatus comprising:

(a) a polishing part, said polishing part comprising a polishing pad; and (b) a slurry distribution part, said slurry distribution part comprising a first slurry supply loop and a second slurry supply loop, said slurry distribution part further comprising a first interface between said first slurry supply loop and said second slurry supply loop, a first and a second mixture of slurry flowing into said first interface, a third mixture of slurry flowing from said first interface, said slurry distribution part further comprising a second interface between said slurry distribution part and said polishing part;

(iii) positioning said at least one substrate inside said self-siphoning Chemical Mechanical Polishing apparatus; and (iv) polishing copper surfaces layers.

13. The method of claim 12, said polishing part comprising:

two cylindrical rollers mounted with axis of said cylindrical rollers being in parallel while being separated by a distance;

said polishing pad mounted over outside surfaces of said two cylindrical rollers;

a substrate carrier for mounting a substrate on the surface thereof;

a polishing pad conditioner mounted aligned with and above said polishing pad;

a platen mounted underneath and in support of said polishing pad in a location where said polishing pad is in contact with said substrate during a process of polishing the surface of said substrate;

means for providing a rotating motion to said two cylindrical rollers in addition to means for providing a rotating motion to said substrate carrier; and means for exerting downward pressure on said substrate carrier.

14. The method of claim 12, said first slurry supply loop comprising:

at least one first slurry container comprising a first slurry;

at least one second slurry container comprising a second slurry;

a splitter orifice box, said splitter orifice box being provided with an orifice flow meter, quantitatively controlling mixing said at least a first and said at least a second slurry, providing a first mixture of slurry;

means for flowing said at least a first slurry and said at least a second slurry to said splitter orifice box, comprising tubing in addition to slurry pump capabilities;

means for flowing said first mixture of slurry to said first interface, providing said first mixture of slurries to said first interface.

15. The method of claim 12, said first interface between said first and second slurry supply loops comprising a valve box, said valve box being provided with means for independently regulating flow of said first mixture of slurry and said second mixture of slurry entering said valve box thereby creating a third mixture of slurry exiting said valve box.

16. The method of claim 12, said at least one second slurry supply loop comprising:

means for flowing said third mixture of slurry from said valve box to said second interface, comprising tubing in addition to slurry pump capabilities, thereby providing said third mixture of slurry to said second interface; and means for flowing said second mixture of slurry from said second interface to said first interface.

17. The method of claim 12, said first mixture of slurry and said a second mixture of slurry and third mixture of slurry being quantitatively interdependent.

18. The method of claim 12, said interface between said slurry distribution part and said polishing pad comprising a slurry reservoir, said third mixture of slurry entering said slurry reservoir, said second mixture of slurry exiting said slurry reservoir, a fourth mixture of slurry being contained in said reservoir to a level, said slurry reservoir being aligned with and being mounted in parallel with said polishing pad, said polishing pad being immersed into said fourth mixture of slurry contained in said reservoir.

19. A method for providing a mixture of slurry to a polishing pad, comprising the steps of:

providing at least one first slurry container comprising at least a first slurry;

providing at least one second slurry container comprising at least a second slurry;

providing means for flowing said at least a first slurry and said at least a second slurry to a splitter orifice box, said splitter orifice box mixing said at least a first slurry and said at least a second slurry, said splitter orifice box further having quantitative control over amounts of said at least a first slurry and said at least a second slurry being mixed, a first mixture of slurry exiting said splitter orifice box;

flowing said first mixture of slurry from said splitter orifice box to a valve box, a second mixture of slurry entering into said valve box, a third mixture of slurry exiting from said valve box, said valve box quantitatively controlling flow of said first mixture of slurry and said second mixture of slurry and said third mixture of slurry;

flowing said third mixture of slurry from said valve box to a third slurry container, said third slurry container comprising a fourth slurry mixture to a level, said third slurry container comprising an interface between said fourth slurry mixture and a polishing pad, said third mixture of slurry entering said third slurry container, said second mixture of slurry exiting said third slurry container, said third slurry container being aligned with and being mounted in parallel with said polishing pad, said polishing pad being immersed into said fourth mixture of slurry contained in said third slurry container; and flowing said third mixture of slurry from said third slurry container to said valve box.

20. The method of claim 19, said polishing pad being provided by providing:

two cylindrical rollers;

said polishing pad mounted over outside surfaces of said two cylindrical rollers;

a substrate carrier for mounting a substrate on the surface thereof;

a polishing pad conditioner mounted aligned with and above said polishing pad;

a platen mounted underneath and in support of said polishing pad where said polishing pad is in contact with said substrate during a process of polishing the surface of said substrate;

means for providing rotating motion to said two cylindrical rollers in addition to means for providing rotating motion to said substrate carrier; and means for exerting downward pressure on said substrate carrier.

21. The method of claim 19, whereby said first mixture of slurry and said a second mixture of slurry and third mixture of slurry are quantitatively interdependent.

22. The method of claim 19, said apparatus being applied for polishing of copper surfaces and surfaces of low-k dielectric layers.

23. A method for polishing surfaces of low-k dielectric layers, comprising the steps of:

(i) providing at least one semiconductor substrate, said substrate having been provided with an exposed layer of low-k dielectric over the surface thereof;

(ii) providing a self-siphoning Chemical Mechanical Polishing apparatus for polishing of said low-k dielectric surface, said a self-siphoning Chemical Mechanical Polishing apparatus comprising:

(a) a polishing part, said polishing part comprising a polishing pad; and (b) a slurry distribution part, said slurry distribution part comprising a first slurry supply loop and a second slurry supply loop, said slurry distribution part further comprising a first interface between said first slurry supply loop and said second slurry supply loop, a first and a second mixture of slurry flowing into said first interface, a third mixture of slurry flowing from said first interface, said slurry distribution part further comprising a second interface between said slurry distribution part and said polishing part;

(iii) positioning said at least one substrate inside said self-siphoning Chemical Mechanical Polishing apparatus; and (iv) polishing the surface of said low-k dielectric layer.

24. The method of claim 23, said polishing part comprising:

two cylindrical rollers mounted with axis of said cylindrical rollers being in parallel while being separated by a distance;

said polishing pad mounted over outside surfaces of said two cylindrical rollers;

a substrate carrier for mounting a substrate on the surface thereof;

a polishing pad conditioner mounted aligned with and above said polishing pad;

a platen mounted underneath and in support of said polishing pad in a location where said polishing pad is in contact with said substrate during a process of polishing the surface of said substrate;

means for providing a rotating motion to said two cylindrical rollers in addition to means for providing a rotating motion to said substrate carrier; and means for exerting downward pressure on said substrate carrier.

25. The method of claim 23, said first slurry supply loop comprising:

at least one first slurry container comprising a first slurry;

at least one second slurry container comprising a second slurry;

a splitter orifice box, said splitter orifice box being provided with an orifice flow meter, quantitatively controlling mixing said at least a first and said at least a second slurry, providing a first mixture of slurry;

means for flowing said at least a first slurry and said at least a second slurry to said splitter orifice box, comprising tubing in addition to slurry pump capabilities;

means for flowing said first mixture of slurry to said first interface, providing said first mixture of slurries to said first interface.

26. The method of claim 23, said first interface between said first and second slurry supply loops comprising a valve box, said valve box being provided with means for independently regulating flow of said first mixture of slurry and said second mixture of slurry entering said valve box thereby creating a third mixture of slurry exiting said valve box.

27. The method of claim 23, said at least one second slurry supply loop comprising:

means for flowing said third mixture of slurry from said valve box to said second interface, comprising tubing in addition to slurry pump capabilities, thereby providing said third mixture of slurry to said second interface; and means for flowing said second mixture of slurry from said second interface to said first interface.

28. The method of claim 23, said first mixture of slurry and said a second mixture of slurry and third mixture of slurry being quantitatively interdependent.

29. The method of claim 23, said interface between said slurry distribution part and said polishing pad comprising a slurry reservoir, said third mixture of slurry entering said slurry reservoir, said second mixture of slurry exiting said slurry reservoir, a fourth mixture of slurry being contained in said reservoir to a level, said slurry reservoir being aligned with and being mounted in parallel with said polishing pad, said polishing pad being immersed into said fourth mixture of slurry contained in said reservoir.

* * * * *